United States Patent
Chen et al.

(10) Patent No.: US 9,342,647 B2
(45) Date of Patent: May 17, 2016

(54) INTEGRATED CIRCUIT DESIGN METHOD AND APPARATUS

(71) Applicant: TAIWAN SEMICONDUCTOR MANUFACTURING COMPANY, LTD., Hsinchu (TW)

(72) Inventors: Shih Hsin Chen, Hsinchu (TW); Kai-Ming Liu, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 32 days.

(21) Appl. No.: 14/258,332

(22) Filed: Apr. 22, 2014

(65) Prior Publication Data

US 2015/0269305 A1  Sep. 24, 2015

Related U.S. Application Data

(60) Provisional application No. 61/968,704, filed on Mar. 21, 2014.

(51) Int. Cl.
*G06F 17/50* (2006.01)
(52) U.S. Cl.
CPC ........ *G06F 17/5081* (2013.01); *G06F 17/5036* (2013.01)
(58) Field of Classification Search
CPC ................ G06F 17/5036; G06F 17/5081
USPC .......................... 716/100, 103, 106
See application file for complete search history.

(56) References Cited

U.S. PATENT DOCUMENTS

| | | | |
|---|---|---|---|
| 5,084,824 A * | 1/1992 | Lam et al. ............... | 716/103 |
| 8,813,004 B1 * | 8/2014 | O'Riordan et al. ......... | 716/102 |
| 2004/0243949 A1 * | 12/2004 | Wang et al. ............... | 716/4 |
| 2005/0177334 A1 * | 8/2005 | Hirano et al. ............. | 702/117 |
| 2005/0216873 A1 * | 9/2005 | Singh et al. .............. | 716/5 |
| 2011/0237005 A1 * | 9/2011 | Kim et al. ................ | 438/16 |

FOREIGN PATENT DOCUMENTS

| | | |
|---|---|---|
| JP | 2004-165572 | 6/2004 |
| JP | 2012-221389 | 11/2012 |

OTHER PUBLICATIONS

Office Action dated Mar. 2, 2016 and English translation from corresponding No. KR 10-2014-0158939.

* cited by examiner

*Primary Examiner* — Paul Dinh
(74) *Attorney, Agent, or Firm* — Hauptman Ham, LLP

(57) ABSTRACT

An integrated circuit design method comprises extracting parallel-connected parameters associated with circuit components of an integrated circuit (IC) based on a determination that the circuit components are connected in parallel. The method also comprises generating a parallel netlist that describes the circuit components, the parallel netlist comprising the parallel-connected parameters. The parallel-connected parameters are taken into consideration by a simulation that determines the performance capabilities of the IC.

20 Claims, 7 Drawing Sheets

INTEGRATED CIRCUIT DESIGN METHOD AND APPARATUS

BACKGROUND

Device manufacturers are challenged to deliver value and convenience to consumers by, for example, providing integrated circuits that offer quality performance. The recent trend in miniaturizing integrated circuits (ICs) has resulted in smaller devices that consume less power, yet provide more functionality at higher speeds. The miniaturization process has also resulted in stricter design and manufacturing tolerances. Pre-manufacture checking and testing are performed to make sure that a semiconductor device having a designed IC can indeed be manufactured and will function as designed.

BRIEF DESCRIPTION OF THE DRAWING

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
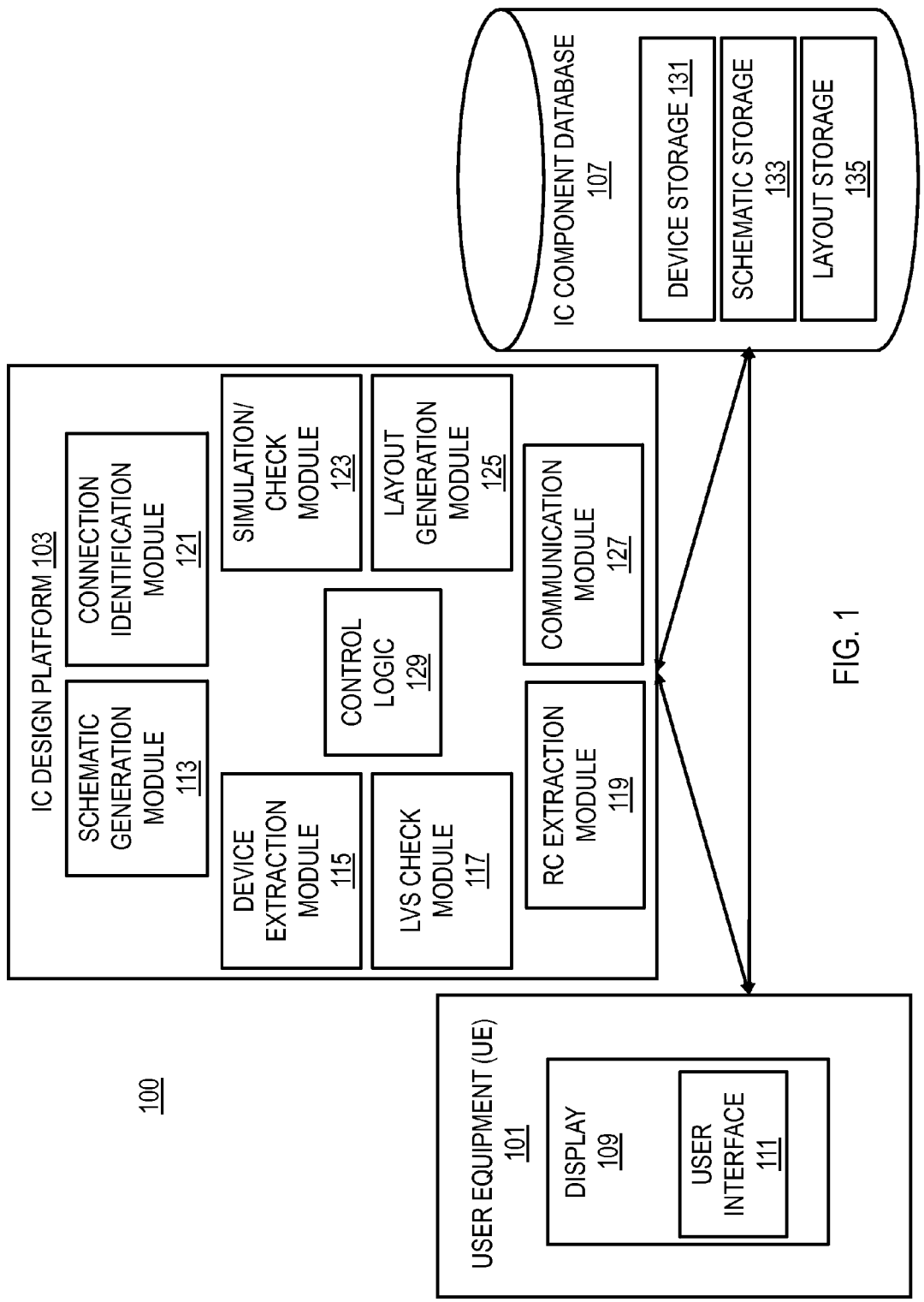
FIG. 1 is a diagram of an integrated circuit design system, in accordance with one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In the drawings, the thickness and width of layers and regions are exaggerated for clarity. Like reference numerals in the drawings denote like elements. The elements and regions illustrated in the figures are schematic in nature, and thus relative sizes or intervals illustrated in the figures are not intended to limit the scope of an inventive concept.

As used here, the term "parallel netlist," or any derivation thereof, generally refers to a netlist of circuit components in one or more of a schematic or a layout of a designed integrated circuit (IC), wherein the parallel netlist includes parallel parameters that describe a parallel electrical connection between one or more circuit components of the designed IC.

Techniques have been developed to represent IC designs at various levels of abstraction. According to these techniques, a designed IC is capable of being represented as a schematic or as a layout. A schematic is an electronic diagram of a designed IC. Schematic diagrams often include symbols that represent circuit components such as transistors, resistors, capacitors, or other circuit components. Schematic diagrams also often include representations of the connections between the circuit components included in the schematic. A layout is a representation of an IC in terms of planar geometric shapes that correspond to the patterns of materials such as metal, oxide, or semiconductor layers that make up the circuit components of an IC.

The circuit components included in the schematic are commonly known as instances. The connections between the circuit components, or "wires" between the circuit components, are commonly known as nets. Schematic netlists are lists that include an inventory of the circuit components (i.e., instances) included in the schematic, and describe the circuit components and included attributes or properties of the circuit components. Schematic netlists also include an inventory of the connections between the circuit components (i.e., nets). Schematic netlists are sometimes stored as netlist files in databases accessible by electronic design automation (EDA) tools.

IC designers often rapidly design and verify circuits, with extensive use of standard, reusable components and design flows. EDA tools allow designers to develop an IC design at the schematic level and verify performance at the schematic level via a pre-layout simulation. If the pre-layout simulation demonstrates that the IC design at the schematic level meets specified performance characteristics, EDA tools generate a layout and perform verification tasks such as design rule checks (DRC) and layout versus schematic (LVS) checks. DRC checks compare the layout to a set of design rules that satisfy a series of recommended parameters set forth by an IC manufacturer to ensure that a manufactured IC functions properly. Design rule sets specify certain geometric and connectivity restrictions to ensure sufficient margins to account for variability in the manufacturing process. LVS checks are often performed after the DRC is complete. EDA tools usually perform LVS checks by extracting the circuit component parameters and connection parameters of the circuit components and the connections between the circuit components, and generating a layout netlist. An EDA tool then compares the layout netlist to the schematic netlist. If the layout netlist and the schematic netlist match within a specified tolerance or are identical, then the layout is "LVS clean."

After the layout passes the DRC and is "LVS clean," EDA tools often run a post-layout simulation to estimate overall circuit performance which includes extracting resistance-capacitance (RC) values from the layout. Extracted RC values are important factors when assessing circuit performance, particularly when high precision and/or high-speed circuits are laid out.

Layout dependent effects (LDE) are also important factors when assessing circuit performance. LDE's such as the coupling effect, the noise canceling effect, device self-heating, parasitic bipolar transistor (pBJT) gain, noise corner issues, or other LDE's affect circuit performance. Some EDA tools perform a layout parameter extraction (LPE) in one or more of the pre-layout or the post-layout stage. These extracted LPE's are considered by the pre-layout or the post-layout simulation to determine LDE's. LPE's extracted by conventional EDA tools, and the LDE's determined by the pre-layout and/or the post-layout simulations are based on individual circuit component parameters, and are not based on, or determined by taking into consideration, the effects that parallel-connected circuit components have on other circuit components, other parallel-connected groups of circuit components, or on one another.

For a designed IC to reach the post-layout simulation stage, a designer often goes through numerous iterations of schematic design, pre-simulation, layout generation, DRC, and/or LVS checks only to learn at the post-layout stage that the designed IC has RC values or LDE's that render the IC design undesirable. If the IC design is undesirable, the designer has to start over. In current design flows, process or simulation corners are often considered for process variation. Process corners represent the extremes of these parameter variations within which a circuit that has been etched onto the wafer must function correctly. A circuit running on devices fabricated at these process corners may run slower or faster than specified and at lower or higher temperatures and voltages, but if the circuit does not function at all at any of these process extremes the design is considered to have inadequate design margin. For example, the pre-layout and/or the post-layout simulations are sometimes used to simulate the various process corners such as Fast-Fast, Slow-Slow, Fast-Slow, Slow-Fast, Typical-Typical, or other suitable process corner. In current design flows, if a process corner range is set as +/−10% for a single circuit component, and the single circuit is connected in parallel to two other single circuits that also have process corner ranges set as +/−10%, common EDA tools compound the process corner range of the three circuit components connected in parallel and the circuit components are simulated as if the process corner range was set as +/−30%. However, for three circuit components in parallel, the simulation corner range should not actually be as wide as +/−30%. Rather, the process corner range should be more like +/−15%. Designers sometimes write parallel-connected parameters, for example 'nf' and 'm' which are commonly used, in the schematic to reflect the correct simulation corner range, but these parallel-connected parameters are not known or not usable in the post-layout simulation stage where EDA tools still extract LPE's and determine LDE's based on individual circuit components. EDA tools that extract LPE's and determine LDE's based on individual circuit components without taking parallel connections between circuit components into consideration often have a gap or variation in LDE's between the layout and the schematic of a designed IC. This means that if a designed IC, for example, includes three circuit components, the pre-layout simulation and the post-layout simulation often differ by about +/−15% for various LDE's determined by the simulations. The ignorance of the influence that the parallel connections between circuit components in an IC have makes it difficult for a designer to avoid multiple iterations of the design process from schematic to layout, which makes the IC design process less efficient.

But, such variation in LDE determinations could be reduced or eliminated if the parallel connections between circuit components are taken into consideration by the pre-layout and/or post-layout simulation. Taking the parallel connections into consideration makes it possible to reduce or entirely eliminate the gap between the pre-layout simulation and the post-layout simulation, because the LDE's influenced by the parallel connections between circuit components, are properly taken into consideration in at least the layout stage.

As such, some embodiments describe an IC design system, method and computer program product in which parallel-connected parameters of one or more circuit components of an IC are extracted by different tools and/or methodologies and considered when determining various LDE effects, and performing one or more simulations to estimate the performance capabilities of a designed IC.

FIG. 1 is a diagram of an IC design system 100, in accordance with one or more embodiments. IC design system 100 makes it possible for a device designer to obtain more accurate simulation results compared to conventional IC design systems and methods, by taking parallel connections between parallel-connected circuit components into consideration when determining various LDE effects and simulating the performance of an IC design, thereby decreasing the gap between the schematic and the layout of an IC design having parallel-connected circuit components.

As shown in FIG. 1, the IC design system 100 comprises user equipment (UE) 101 having connectivity to IC design platform 103, and IC component database 107.

The UE 101 is a type of mobile terminal, fixed terminal, or portable terminal including a desktop computer, laptop computer, notebook computer, netbook computer, tablet computer, wearable circuitry, mobile handset, or combination thereof. The UE 101 comprises display 109 by which user interface 111 is displayed. A user interacts with the IC design platform 103 using user interface 111 to design an IC, generate a schematic of the designed IC, simulate performance of the designed IC, and generate a layout of the designed IC.

IC design platform 103 is a set of computer readable instructions that, when executed by a processor such as processor 703 (FIG. 7), facilitates designing an IC, generates a schematic of the designed IC, conducts performance simulations of the designed IC, and generates a layout of the designed IC. The IC design platform 103 comprises a plurality of computing modules including schematic generation module 113, device extraction module 115, LVS check module 117, RC extraction module 119, connection identification module 121, simulation/check module 123, layout generation module 125, communication module 127 by which the IC design platform 103 communicates with the UE 101 and the IC component database 107, and control logic 129 that governs communications between the various modules of the IC design platform 103. In some embodiments, the various modules that are included in the IC design platform 103 are EDA tools used for testing a design of an IC before manufacturing the same device. The modules or EDA tools, in some embodiments, are one or more sets of executable instructions for execution by a processor or controller, or a programmed computer to perform an indicated functionality.

IC component database 107 is a memory such as memory 705 (FIG. 7) capable of being queried by the IC design platform 103 based on a user interaction with the user interface 111. The IC component database comprises device storage 131, schematic storage 133, and layout storage 135.

The UE 101, IC design platform 103, and IC component database 107 are together configured as a special purpose computer system. In some embodiments, one or more of the UE 101, IC design platform 103, and IC component database are unitarily embodied in the UE 101. The UE 101, accordingly, comprises a processor by which the IC design platform 103 is executed. In some embodiments, one or more of the UE 101, IC design platform 103 and IC component database 107 are configured to be located remotely from the each other. If located remotely, the IC design platform 103 is executed by a processor that is also positioned remotely from the UE 101 such as another UE 101. By way of example, the UE 101, IC design platform 103, and IC component database 107 communicate by wired or wireless communication connection and/or one or more networks, or combination thereof.

Based on one or more user interactions with the user interface 111, an IC is designed, and the IC design platform 103, by way of the schematic generation module 113, generates a schematic representing the designed IC. A designed IC, for example, has one or more circuit components. The one or more interactions with the user interface 111 include, for example, inputting one or more circuit component parameters such as length, width, spacing, material, location, estimated RC value, or other suitable device parameter that describes a circuit component, or sub-components thereof. IC circuit components comprise, for example, resistors, transistors, wires, capacitors, switches, nodes, interconnects, vias, gates, sources, drains, doped regions, channels, or other suitable electrical devices. In some embodiments, the one or more circuit components in the designed IC are connected to interconnect wires.

In some embodiments, based on the input circuit component parameters, the IC design platform 103, by way of the communication module 127, searches the device storage 131 for stored circuit components that identically match, or match within a predetermined threshold, therefore being similar to, those circuit components that are to be included in the designed IC. The IC design platform 103 also searches for various configurations, patterns or arrangements of the circuit components that are to be included in the designed IC. The IC design platform 103 causes the search results to be displayed to the user via the user interface 111 for selection and inclusion the schematic generated by the schematic generation module 113. In addition to circuit components and circuit component configurations, the device storage 131 also stores data associated with estimated RC values of the one or more circuit components and one or more configurations or patterns of the one or more circuit components, as well as other determinable circuit component performance factors such as allowable materials that are used when producing a circuit component, or associated masks used to produce a circuit component, for example. At least one of the displayed circuit component configurations is selected by a user interaction with the user interface 111 for a corresponding circuit component that is to be included in the schematic as a symbol representing the selected circuit component. Based on the user selection, the schematic generation module 113 generates the schematic including the selected circuit component configuration.

In some embodiments, the designed IC is generated or provided in the form of a schematic netlist, such as a Simulation Program with Integrated Circuit Emphasis (SPICE) netlist, or other suitable data format for inputting an IC design. The generated or provided schematic netlist is optionally converted to a schematic representation of the designed IC, or the provided schematic netlist is used as an input for one or more subsequent processes without generating a graphical representation of the designed IC.

The simulation/check module 123 performs a pre-layout simulation of the schematic to conduct an electrical analysis of the circuit components included in the schematic. In some embodiments, the simulation/check module 123, for example, comprises or is an EDA tool configured to determine whether the designed IC meets a predetermined performance specification. If the designed IC does not meet the predetermined specification, the IC is redesigned. In some embodiments, the pre-layout simulation is a circuit performance simulation suitable for determining if one or more predetermined performance specifications are met such as a SPICE simulation that is performed on the generated schematic, or the provided schematic netlist.

In some embodiments, the simulation/check module 123 performs a DRC check to determine if the schematic or the provided schematic netlist passes one or more design rules with which the designed IC should comply, at least within a predetermined tolerance. If the schematic/provided schematic netlist passes the DRC check, then the schematic generation module 113, if not already provided, or if the provided schematic netlist is modified, generates a schematic netlist that includes the description of circuit components and the interconnect wires included in the schematic or the modified provided schematic netlist having passed the design rule check. The IC design platform 103 then causes the schematic netlist to be stored in the schematic storage 133. The DRC ensures that the designed IC is capable of being manufactured. If one or more design rules is violated, or a determination that one or more specifications of the designed IC are not within a predetermined tolerance of the violated design rule(s), the IC design platform 103 indicates that a correction to the designed IC should be made at one or more of the layout or the schematic/design stage.

The layout generation module 125 generates a layout of the designed IC, and the IC design platform 103 causes the user interface 111 to display the generated layout of the designed IC. In some embodiments, the layout is generated in the form of a Graphic Design System (GDS) file or other suitable data format for describing the generated layout. In some embodiments, the layout is generated in the form of a layout netlist that describes the circuit components included in the layout of the designed IC.

The device extraction module 115 alone, or in combination with one or more other modules of the IC design platform 103 such as the connection identification module 121, recognizes the circuit components in the designed IC layout, as well as connections therebetween, and extracts circuit component parameters and connection parameters from the generated layout. The IC design platform 103 by way of one or more of the device extraction module 115, the layout generation module 125, or the LVS check module 117, generates a layout netlist describing the circuit components and interconnect wires included in the layout of the designed IC and stores the layout netlist in the layout storage 135.

The LVS check module 117 conducts a LVS check comparing the layout netlist to the schematic netlist to determine if the layout and the schematic identically match, match within a predetermined tolerance or threshold, or if there is a conflict between the layout and the schematic (i.e., the layout netlist and the schematic netlist do not identically match or do not match within the predetermined tolerance or threshold). In some embodiments, if the LVS check module 117 determines there is a conflict between the layout and the schematic, the IC design platform 103 causes an instruction to be displayed by user interface 111 that the schematic should be corrected. In some embodiments, the IC design platform 103 causes the determined conflicting portion of the IC in the layout or in the schematic to be highlighted in the layout or in the schematic. Alternatively, if the designed IC does not pass the LVS check, the IC design platform 103 does not generate or cause the layout to be displayed.

In some embodiments, the IC design platform 103 causes the IC component database 107 to be generated based on user inputs with respect to various circuit component parameters, expected RC values, manually input parallel-connected parameters, estimated LDE effects, estimated RC values, or other suitable design factors taken into consideration such as whether a particular schematic or configuration of a circuit component passed the DRC check and/or passed other design or manufacturing constraint limitations that are stored in IC component database 107.

The RC extraction module 119 extracts RC values for the designed IC. The RC extraction module 119 determines parasitic parameters, e.g., parasitic resistance and parasitic capacitance, of interconnects in the designed IC's layout for circuit performance simulations in a subsequent operation. Such parasitic parameters often occur as a result of configurations and/or materials of the pattern in the layout. In some embodiments, a technology file recalled from the IC component database 107 is used by the RC extraction module 119 to extract parasitic parameters. In some embodiments, the extracted parasitic parameters are added by the RC extraction module 119 to the layout netlist provided by the device extraction module 115 to output an updated layout netlist.

The simulation/check module 123 performs a post-layout simulation to determine, taking the extracted parasitic parameters into account, whether the layout meets a predetermined specification. Specifically, the simulation/check module 123 performs a simulation on the updated layout netlist that is output by the RC extraction module 119. If the simulation indicates that the layout does not meet the predetermined specification (e.g., if the parasitic parameters or the LDE's cause undesirable delays) the IC design platform 103 indicates that a correction needs to be made to at least one of the layout or the schematic of the designed IC. Otherwise, the layout is passed to manufacturing or an additional verification processes. In some embodiments, the post-layout simulation is a SPICE simulation, or other suitable simulation tool usable, in place of or, in addition to, the SPICE simulation, to assess the performance capabilities of the designed IC.

Unlike conventional IC design systems that employ LPE flows that extract circuit component parameters of a designed IC having parallel-connected circuit components individually at a device extraction stage, but do not consider the parallel-connected parameters when determining LDE effects, and/or conducting performance simulations of the designed IC, the IC design system 100 is configured to, by way of the IC design platform 103, determine if one or more circuit components of the designed IC are connected in parallel, associate the circuit components that are connected in parallel with one another, and take the parallel connection of the parallel-connected circuit components (i.e., the parallel-connected parameters) into consideration when determining various LDE effects, and conducting performance simulations on the designed IC.

For example, if a designed IC X1 has a plurality of circuit components M1-M7, when circuit component parameters of circuit component M1 are extracted, circuit component M1 is usually not associated with, or does not have information related to, other circuit components M2-M7, because the circuit components M1-M7 are extracted individually, despite some of the circuit components M1-M7 actually being connected in parallel. The IC design system 100, however, is capable of determining if one or more circuit components M2-M7 of the example designed IC X1 are connected in parallel with circuit component M1, for example, and associating identified parallel-connected circuit components with one another. For example, the IC design platform 103 might determine that circuit components M1-M5 are connected to one another in parallel, and update one or more of the schematic netlist or the layout netlist stored in the schematic storage 133 or the layout storage 135 to generate a parallel netlist by attaching or adding the parallel-connected parameters indicating the parallel connection between the identified parallel-connected circuit components to the schematic netlist or the layout netlist, thereby associating circuit components M1-M5 with one another. The IC design platform 103 is then able to take the parallel-connected parameters of the parallel-connected circuit components M1-M5 into consideration when determining various LDE effects, and conducting performance simulations on the designed IC.

In some embodiments, an example schematic or pre-simulation netlist generated by the IC design platform 103 is as follows:

X1 dg s b nch w=10 um l=1 um nf=2 multi=3

The above-example schematic netlist is for the designed IC X1. The schematic netlist describing designed IC X1 includes information identifying circuit component parameters such as a drain terminal identifier d, a gate terminal identifier g, a source terminal identifier s, a bulk terminal identifier b, a width w (in this example w=10 um), a length l (in this example l=1 um), a number of parallel-connected circuit components nf (in this example nf=2), and a number of instances or groups of parallel-connected circuit components "multi" (in this example, multi=3). Because there are two parallel-connected circuit components, and three instances of parallel-connected circuit components, the designed IC X1, in this example, includes six total circuit components.

In some embodiments, an example layout netlist, or post-simulation netlist, without the parallel-connected parameters indicating the association between the individual circuit components that the designed IC X1 includes is generated by the IC design platform 103 as follows:

M1 dg s b nch w=10 u l=1 u nf=1 multi=1
M2 dg s b nch w=10 u l=1 u nf=1 multi=1
M3 dg s b nch w=10 u l=1 u nf=1 multi=1
M4 dg s b nch w=10 u l=1 u nf=1 multi=1
M5 dg s b nch w=10 u l=1 u nf=1 multi=1
M6 dg s b nch w=10 u l=1 u nf=1 multi=1

The IC design platform 103, in this example, split-up the layout netlist that describes the designed IC into six parts that individually describe circuit components M1-M6. To determine the LDE effects, in some embodiments, the IC design platform 103 separates the circuit components of the designed IC described in the schematic netlist or the layout netlist, and includes the parallel-connected parameters indicating the association between the parallel-connected circuit components M1-M6 to generate the parallel netlist so that the simulation/check module 123 can take the parallel-connected parameters into consideration when determining the LDE effects, and/or conducting a performance simulation of the designed IC.

In some embodiments, the IC design platform 103 generates the parallel netlist having the parallel-connected parameters by attaching the parallel-connected parameters to the layout netlist, the parallel netlist describes the individual circuit components M1-M6 as follows:

M1 dg s b nch w=10 u l=1 u nf=1 multi=1 _total=6 _od=2
M2 dg s b nch w=10 u l=1 u nf=1 multi=1 _total=6 _od=2
M3 dg s b nch w=10 u l=1 u nf=1 multi=1 _total=6 _od=2
M4 dg s b nch w=10 u l=1 u nf=1 multi=1 _total=6 _od=2
M5 dg s b nch w=10 u l=1 u nf=1 multi=1 _total=6 _od=2
M6 dg s b nch w=10 u l=1 u nf=1 multi=1 _total=6 _od=2

In this example, the IC design platform 103, by way of one or more of the device extraction module 115, the LVS check module 119, the connection identification module 121, the RC extraction module 119, or the layout generation module 125, extracted and attached the parallel-connected parameters associated with the circuit components M1-M6 by indicating the total number of devices that are connected in parallel to the layout netlist for circuit components M1-M6. In the parallel netlist, "_total" is the number of all parallel-connected devices, and "_od" is the number of all parallel-connected devices on a same oxide definition (OD) layer in the layout generated by the layout generation module 125. In this example, the schematic netlist that indicates the number of instances or groupings of parallel-connected circuit components that are included in the schematic is mapped out in the generated layout by the layout generation module 125 such that each grouping of parallel-connected circuit components includes two circuit components, and the layout generation module 125 generates a layout of the designed IC such that each grouping of two parallel-connected circuit components is represented as being on a same OD layer.

The accuracy and speed of the parallel-connected parameter extraction are considerations which, under certain circumstances, might be in conflict. An accurate parallel-connected parameter extraction results in an accurate determination of LDE effects in a subsequent post-layout simulation which permits an accurate evaluation of the layout for IC's to be manufactured. But, an accurate parallel-connected parameter extraction often demands more computing resources and is therefore slower than a less accurate parallel-connected parameter extraction. In some embodiments, the IC design platform 103 is configured to sacrifice some degree of accuracy to obtain a desired parallel-connected parameter extraction speed by performing a less accurate parallel-connected parameter extraction while still reducing the gap between the layout and the schematic as compared to conventional IC design systems.

In some embodiments, the IC design platform 103 is configured to extract and attach parallel-connected parameters by way of the LVS check module 117 at the LVS stage. The LVS check module 117, for example, scans all the circuit components in the designed IC and determines if the circuit components in the designed IC are connected in parallel. The device extraction module 115, connection identification module 121, and/or the LVS check module 117 also determines circuit component parameters such as device name, OD index number and other LDE parameters. The IC design platform 103, by way of the LVS check module 117 for example, causes the determined parallel-connection information and the circuit component parameters from the schematic netlist and/or the layout netlist to be stored in IC component database 107. The LVS check module 117 counts the numbers of circuit components in the layout of the designed IC that have identical attributes or conditions, generates parallel-connected parameters that describe the association between the circuit components having the identical attributes or conditions, and attaches the determined parallel-connected parameters to the layout netlist at the LVS stage describing the circuit components of the designed IC, thereby generating the parallel netlist.

In other embodiments, the IC design platform 103, by way of the device extraction module 115, is configured to, at the LVS stage, extract a netlist identifier (net ID) and a polygon ID to be used as circuit component parameters. The net ID is an integer that represents the circuit component (e.g., the type of circuit component and/or connections or wires). The polygon ID is an integer that represents the polygon or shape that the circuit component takes and/or a material description. The IC design platform 103, by way of the simulation/check module 123, uses a post-processing program to scan the layout netlist and replaces the net ID and the polygon ID in the layout netlist with the parallel-connected parameters, thereby generating the parallel netlist. In this example embodiment, because the layout netlist is used as an input, the parallel netlist is changed compared to the layout netlist generated at a previous stage. The IC design platform 103 causes the parallel netlist to be stored in the layout storage 135.

In some embodiments, the IC design platform 103 is configured to determine the parallel-connected parameters by a faster, but less accurate, method that uses a LVS comparison and cross-reference method at a post-simulation stage. The cross-reference method correlates the circuit component, or instance, names describing the circuit components of the designed IC included in the layout netlist with the names of the circuit components of a designed IC included in the schematic netlist to identify circuit components that are connected in parallel. The cross-referenced correlation between circuit components is then applied by modifying the layout netlist, to include parallel-connected parameters indicating that circuit components are associated and connected in parallel, thereby generating the parallel netlist.

For example, the IC design platform 103, by way of the schematic generation module 113 LVS check module 117, the schematic generation module 113, generates the schematic netlist of the designed IC, generates the layout netlist by way of the LVS check module 117, and cross-references, by way of the simulation/check module 123 for example, the schematic netlist with the layout netlist to determine the circuit components included in the layout netlist are connected in parallel. The IC design platform 103, by way of the simulation/check module 123 for example, renames the circuit components in the layout netlist using a different naming convention that ties the circuit components together indicating the circuit components are connected in parallel. The newly applied naming convention comprises the parallel-connected parameters, or at least describes the parallel connections or association between the circuit components, and the simulation/check module 123 thereby generates the parallel netlist by removing the circuit component descriptions in the layout netlist and adding the circuit component descriptions having the naming convention that describes the parallel connections in place of the removed circuit component descriptions. Though not as accurate as some of the other example embodiments, this method is faster and reduces the gap between the schematic and the layout of the designed IC at the pre-simulation and the post-simulation stages.

In some embodiments, the IC design platform 103, by way of the RC extraction module 119 at the RC extraction stage, generates the parallel netlist by attaching determined parallel-connected parameters to the layout netlist. The RC extraction module 119, for example, scans all the circuit components in the designed IC and determines if the circuit components in the designed IC are connected in parallel. The device extraction module 115, connection identification module 121, and/or the RC extraction module 119 also determines circuit component parameters such as device name, OD index number and other LDE parameters. The IC design platform 103, by way of the RC extraction module 119 for example, causes the determined parallel-connection information and the circuit component parameters from the schematic netlist and/or the layout netlist to be stored in IC component database 107. The RC extraction module 119 counts the numbers of circuit components in the layout of the designed IC that have identical attributes or conditions, generates parallel-connected parameters that describe the association between the circuit components having the identical attributes or conditions, and attaches the determined parallel-connected parameters to the layout netlist at the RC extraction stage describing the circuit components of the designed IC, thereby generating the parallel netlist.

To increase the accuracy of the pre-layout and/or the post-layout simulations, the IC design platform 103, and any module thereof, is not limited to extracting parallel-connected parameters within a predetermined boundary. Rather, the IC design platform 103 is configured to extract parallel-parameters, as well as other circuit component parameters, no matter how far attenuated the circuit components of the designed IC are. This is because no matter how far apart one or more circuit components are from one another, the parallel connection between them should be taken into consideration when determining the LDE effects, and/or conducting a performance simulation of the designed IC.

Figure 2:
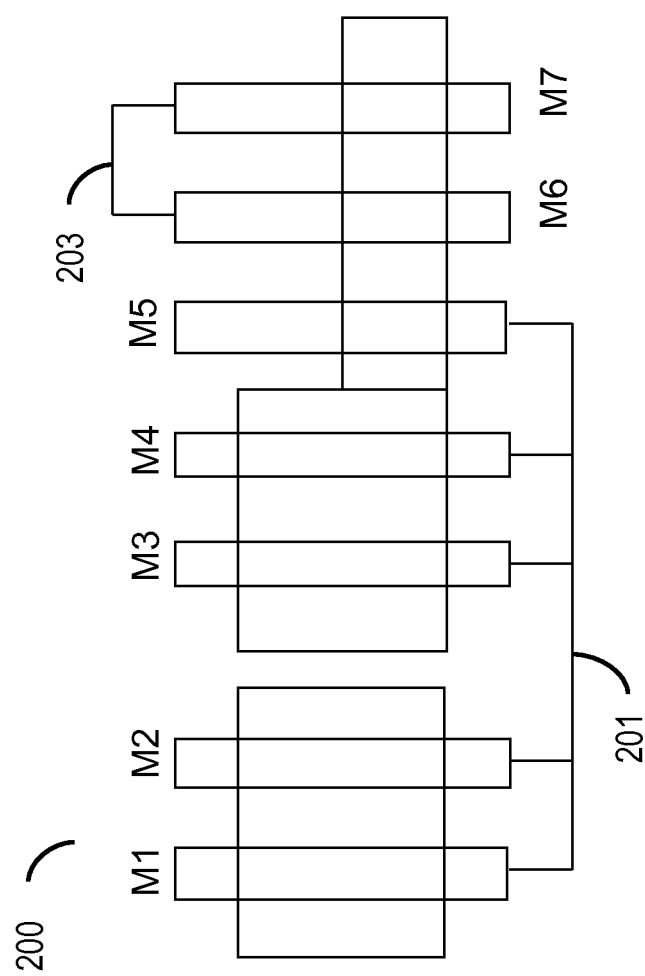
FIG. 2 is a diagram of an integrated circuit having parallel-connected circuit components, in accordance with one or more embodiments.

FIG. 2 is a diagram of a designed IC 200 having parallel-connected circuit components, in accordance with one or more embodiments.

The designed IC 200, in this example embodiment, comprises circuit components M1, M2, M3, M4, M5, M6, and M7. Circuit components M1, M2, M3, M4, and M5 are connected in parallel forming a first parallel-connected group 201. Circuit components M6 and M7 are connected in parallel forming a second parallel-connected group 203.

The IC design platform 103 (FIG. 1) determines circuit component parameters of the designed IC 200 and determines parallel-connected parameters associated with the circuit components M1-M7 describing the parallel-connected relationships between the circuit components M1-M7 of the designed IC 200.

Figure 3:
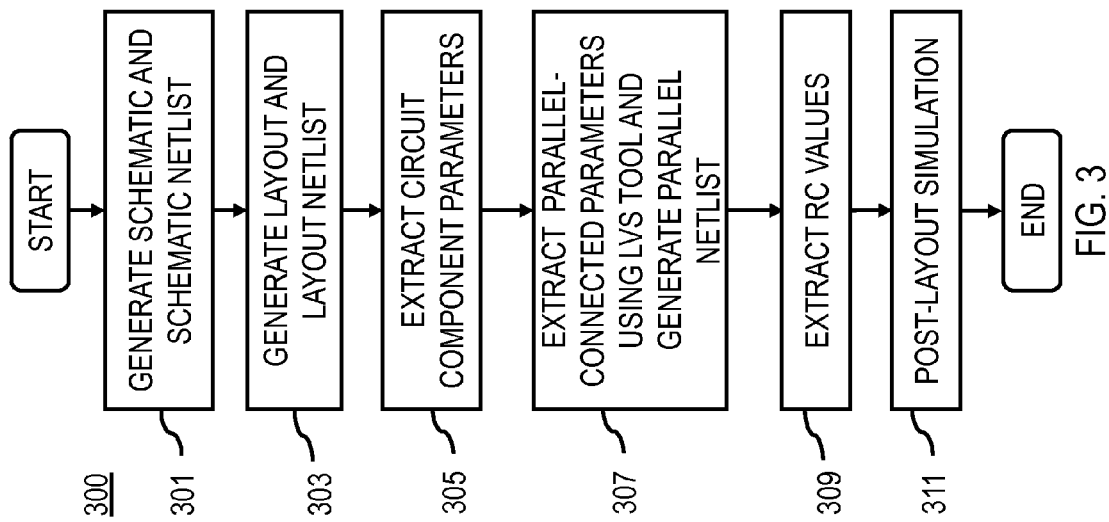
FIG. 3 is a flowchart of a method of extracting parallel-connected parameters from parallel-connected circuit components, in accordance with one or more embodiments.

FIG. 3 is a flowchart of a method 300 of extracting parallel-connected parameters from parallel-connected circuit components, in accordance with one or more embodiments.

Method 300 begins with step 301 in which the IC design platform 103 generates a schematic of a designed IC and generates a schematic netlist describing the circuit components included in the schematic. In step 303, IC design platform 103 generates a layout of the designed IC and a layout netlist that describes the circuit components in the layout. In step 305, IC design platform 103 extracts circuit component parameters and/or connection parameters from the schematic or the layout. In step 307, IC platform 103 extracts parallel-connected parameters describing parallel connections between the circuit components included in the designed IC and generates a parallel netlist using a LVS tool. The parallel-connected parameters are determined based on one or more of the schematic netlist or the layout netlist generated by the IC design platform 103. In step 309, the IC design platform 103 extracts RC values associated with the circuit components in the designed IC. In step 311, the IC design platform 103 conducts a performance simulation on the designed IC taking the parallel-connected parameters into consideration.

Figure 4:
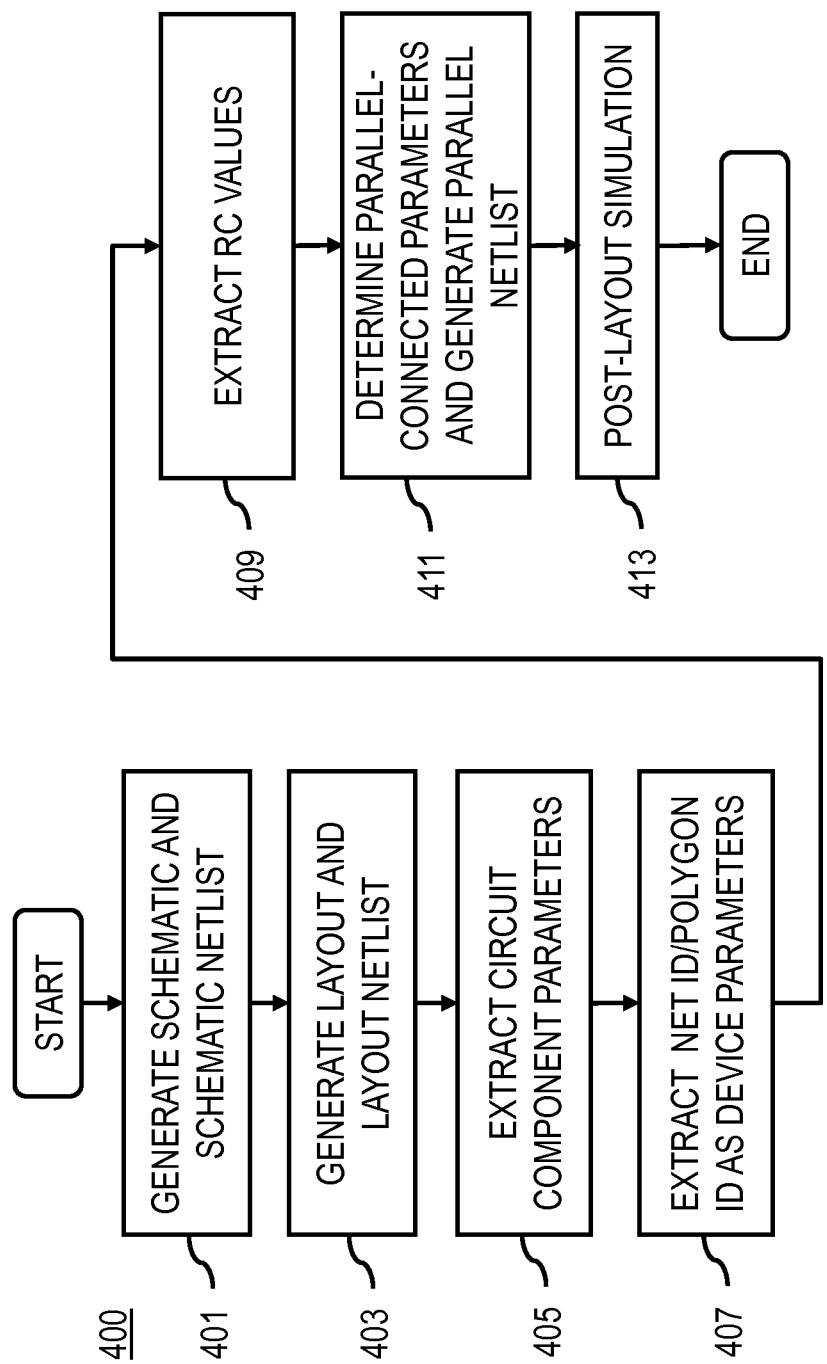
FIG. 4 is a flowchart of a method of extracting parallel-connected parameters from parallel-connected circuit components, in accordance with one or more embodiments.

FIG. 4 is a flowchart of a method 400 of extracting parallel-connected parameters from parallel-connected circuit components, in accordance with one or more embodiments.

Method 400 begins with step 401 in which the IC design platform 103 generates a schematic of a designed IC and generates a schematic netlist describing the circuit components included in the schematic. In step 403, IC design platform 103 generates a layout of the designed IC and a layout netlist that describes the circuit components in the layout. For example, the layout netlist at this stage appears as follows:

M1 D G S B nch L=4e-08 W=3e-07 . . . net_d=20712 net_g=30589 net_s=20717 net_b=67605 od_id=5855

In step 405, IC design platform 103 extracts circuit component parameters and/or connection parameters from the schematic or the layout. In step 407, IC platform 103 extracts a net ID and a polygon ID describing the circuit components. In step 409, the IC design platform 103 extracts RC values associated with the circuit components in the designed IC. The IC design platform 103, at this stage, updates the layout netlist to reflect the extracted RC values. The layout netlist at this stage appears as follows:

M1 M1:DRN M1:GATE M1:SRC M1:BULK nch L=4e-08 W=3e-07 . . . net_d=20712 net_g=30589 net_s=20717 net_b=67605 od_id=5855

In step 411, IC design platform 103 determines the parallel-connected parameters describing parallel connections between the circuit components included in the designed IC and generates a parallel netlist by replacing the extracted net ID and the polygon ID with the parallel-connected parameters. The parallel-connected parameters are determined based on the layout netlist generated by the IC design platform 103 following the RC extraction. The parallel netlist at this stage appears as follows:

M1 M1:DRN M1:GATE M1:SRC M1:BULK nch L=4e-08 W=3e-07 . . . _total=20 od=4

In step 413, the IC design platform 103 conducts a performance simulation on the designed IC taking the parallel-connected parameters into consideration.

Figure 5:
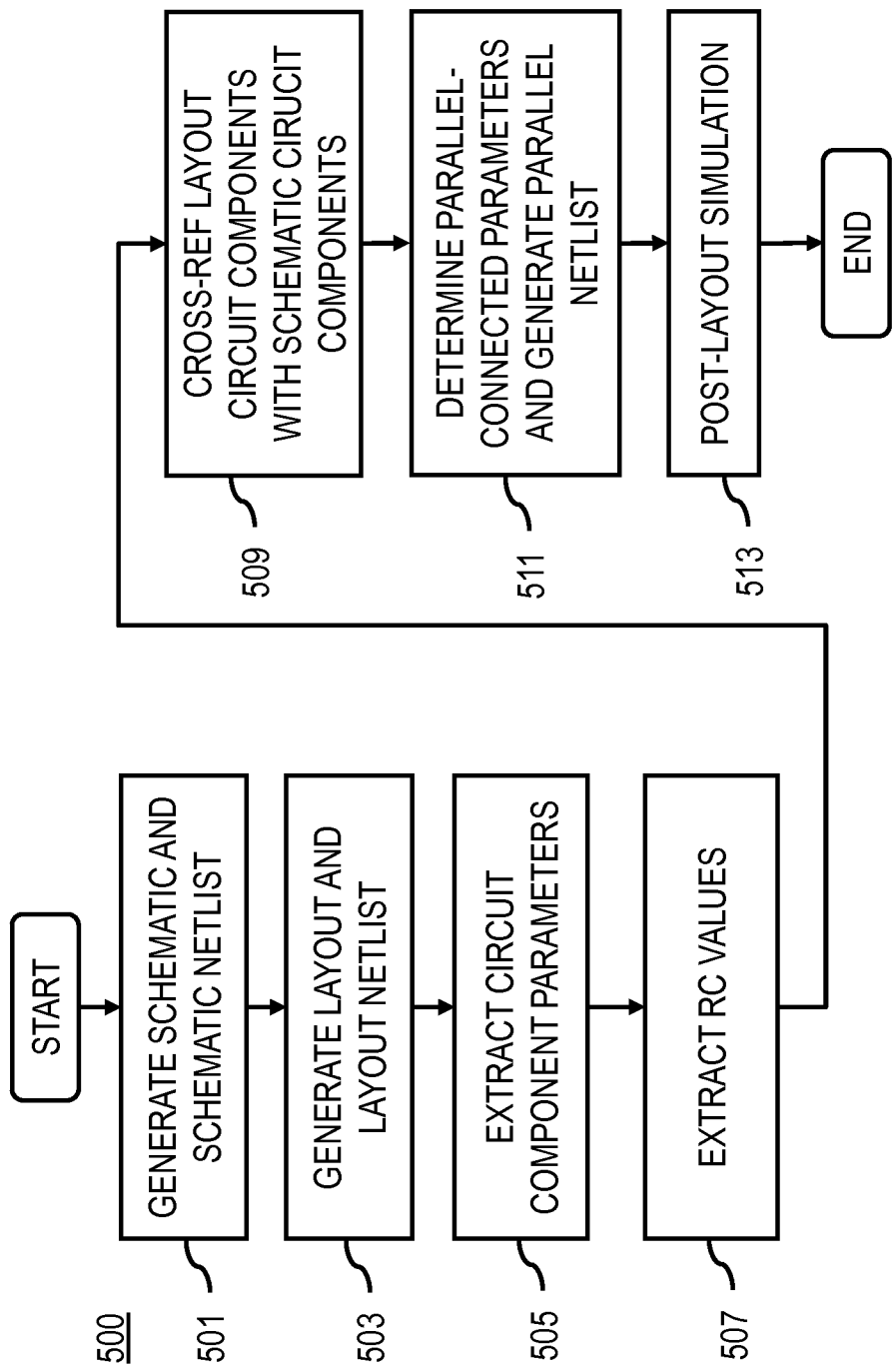
FIG. 5 is a flowchart of a method of extracting parallel-connected parameters from parallel-connected circuit components, in accordance with one or more embodiments.

FIG. 5 is a flowchart of a method 500 of extracting parallel-connected parameters from parallel-connected circuit components, in accordance with one or more embodiments.

Method 500 begins with step 501 in which the IC design platform 103 generates a schematic of a designed IC and generates a schematic netlist describing the circuit components included in the schematic. For example, the schematic netlist includes a description of the circuit components as follows:

M1 multi=3

In step 503, IC design platform 103 generates a layout of the designed IC and a layout netlist that describes the circuit components in the layout. For example, the layout netlist at this stage includes a description of the circuit components as follows:

M1
M2
M3

In step 505, IC design platform 103 extracts circuit component parameters and/or connection parameters from the schematic or the layout. In step 507, IC design platform 103 extracts RC values associated with the circuit components in the designed IC. The IC design platform 103, at this stage, updates the layout netlist to reflect the extracted RC values. In step 509, the IC design platform 103 cross references the circuit components in the layout netlist with the circuit components in the schematic netlist to determine if there is a correlation between the circuit components in the designed IC. In step 511, IC design platform 103 determines the parallel-connected parameters describing parallel connections between the circuit components based on the cross-referencing and generates a parallel netlist by replacing the circuit component names used in the layout netlist with names using a different naming convention that describes the parallel connection or association between the circuit components with the parallel-connected parameters. The parallel netlist at this stage includes a description of the circuit components as follows:

M1
M1_1
M1_2

In step 513, the IC design platform 103 conducts a performance simulation on the designed IC taking the parallel-connected parameters into consideration.

Figure 6:
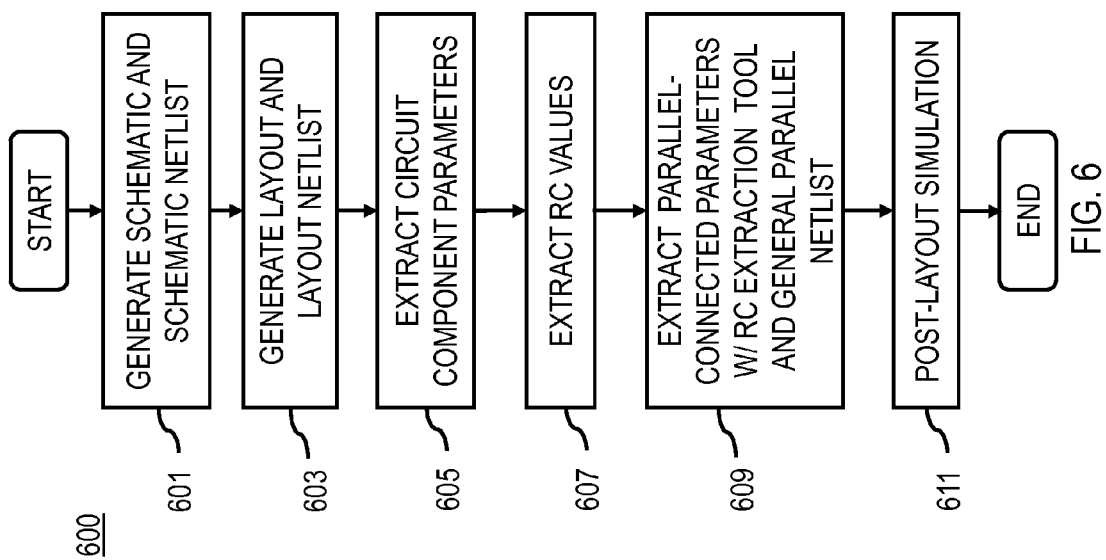
FIG. 6 a flowchart of a method of extracting parallel-connected parameters from parallel-connected circuit components, in accordance with one or more embodiments.

FIG. 6 is a flowchart of a method 600 of extracting parallel-connected parameters from parallel-connected circuit components, in accordance with one or more embodiments.

Method 600 begins with step 601 in which the IC design platform 103 generates a schematic of a designed IC and generates a schematic netlist describing the circuit components included in the schematic. In step 603, IC design platform 103 generates a layout of the designed IC and a layout netlist that describes the circuit components in the layout. In step 605, IC design platform 103 extracts circuit component parameters and/or connection parameters from the schematic or the layout. In step 607, the IC design platform 103 extracts RC values associated with the circuit components in the designed IC using an RC extraction tool. In step 609, IC platform 103 extracts parallel-connected parameters describing parallel connections between the circuit components included in the designed IC and generates a parallel netlist using the RC extraction tool. The parallel-connected parameters are determined based on one or more of the schematic netlist or the layout netlist generated by the IC design platform 103 In step 311, the IC design platform 103 conducts a performance simulation on the designed IC taking the parallel-connected parameters into consideration.

Figure 7:
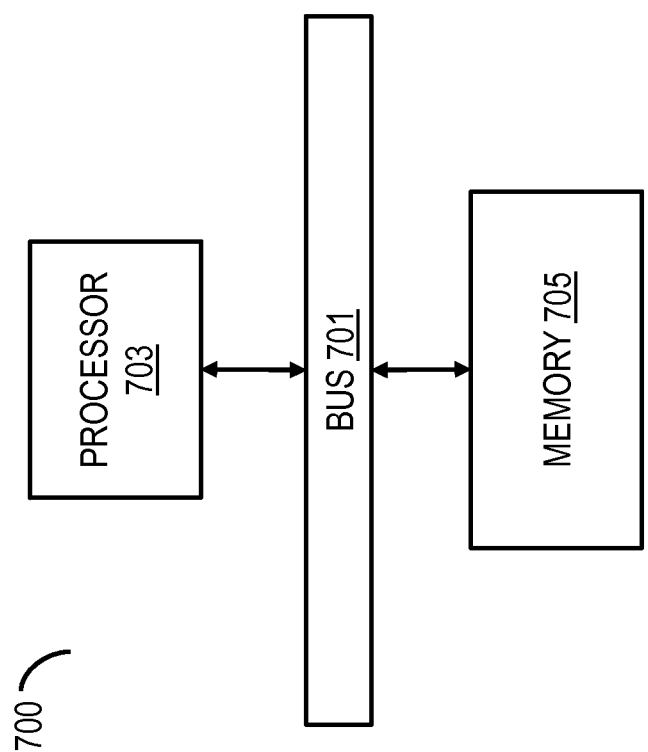
FIG. 7 is a diagram of a chip set by which an embodiment is implemented.

FIG. 7 is a functional block diagram of a computer or processor-based system 700 upon which or by which an embodiment is implemented.

Processor-based system 700 is programmed to extract parallel-connected parameters from a designed IC and conduct a performance simulation of the designed IC that takes the parallel-connected parameters into consideration, as described herein, and includes, for example, bus 701, processor 703, and memory 705 components.

In some embodiments, the processor-based system is implemented as a single "system on a chip." Processor-based system 700, or a portion thereof, constitutes a mechanism for performing one or more steps of extracting parallel-connected parameters from a designed IC and conducting a performance simulation of the designed IC that takes the parallel-connected parameters into consideration.

In some embodiments, the processor-based system 700 includes a communication mechanism such as bus 701 for transferring information and/or instructions among the components of the processor-based system 700. Processor 703 is connected to the bus 701 to obtain instructions for execution and process information stored in, for example, the memory 705. In some embodiments, the processor 703 is also accompanied with one or more specialized components to perform certain processing functions and tasks such as one or more digital signal processors (DSP), or one or more application-specific integrated circuits (ASIC). A DSP typically is configured to process real-world signals (e.g., sound) in real time independently of the processor 703. Similarly, an ASIC is configurable to perform specialized functions not easily performed by a more general purpose processor. Other specialized components to aid in performing the functions described herein optionally include one or more field programmable gate arrays (FPGA), one or more controllers, or one or more other special-purpose computer chips.

In one or more embodiments, the processor (or multiple processors) 703 performs a set of operations on information as specified by a set of instructions stored in memory 705 related to extracting parallel-connected parameters from a designed IC and conducting a performance simulation of the designed IC that takes the parallel-connected parameters into consideration. The execution of the instructions causes the processor to perform specified functions.

The processor 703 and accompanying components are connected to the memory 705 via the bus 701. The memory 705 includes one or more of dynamic memory (e.g., RAM, magnetic disk, writable optical disk, etc.) and static memory (e.g., ROM, CD-ROM, etc.) for storing executable instructions that when executed perform the steps described herein to extract parallel-connected parameters from a designed IC and conduct a performance simulation of the designed IC that takes the parallel-connected parameters into consideration. The memory 705 also stores the data associated with or generated by the execution of the steps.

In one or more embodiments, the memory 705, such as a random access memory (RAM) or any other dynamic storage device, stores information including processor instructions for extracting parallel-connected parameters from a designed IC and conducting a performance simulation of the designed IC that takes the parallel-connected parameters into consideration. Dynamic memory allows information stored therein to be changed by system 100. RAM allows a unit of information stored at a location called a memory address to be stored and retrieved independently of information at neighboring addresses. The memory 705 is also used by the processor 703 to store temporary values during execution of processor instructions. In various embodiments, the memory 705 is a read only memory (ROM) or any other static storage device coupled to the bus 701 for storing static information, including instructions, that is not changed by the system 100. Some memory is composed of volatile storage that loses the information stored thereon when power is lost. In some embodiments, the memory 705 is a non-volatile (persistent) storage device, such as a magnetic disk, optical disk or flash card, for storing information, including instructions, that persists even when the system 100 is turned off or otherwise loses power.

The term "computer-readable medium" as used herein refers to any medium that participates in providing information to processor 703, including instructions for execution. Such a medium takes many forms, including, but not limited to computer-readable storage medium (e.g., non-volatile media, volatile media). Non-volatile media includes, for example, optical or magnetic disks. Volatile media include, for example, dynamic memory. Common forms of computer-readable media include, for example, a floppy disk, a flexible disk, a hard disk, a magnetic tape, another magnetic medium, a CD-ROM, CDRW, DVD, another optical medium, punch cards, paper tape, optical mark sheets, another physical medium with patterns of holes or other optically recognizable indicia, a RAM, a PROM, an EPROM, a FLASH-EPROM, an EEPROM, a flash memory, another memory chip or cartridge, or another medium from which a computer can read. The term computer-readable storage medium is used herein to refer to a computer-readable medium.

An aspect of this disclosure relates to integrated circuit design method performed by a processor. The method comprises extracting parallel-connected parameters associated with circuit components of an integrated circuit (IC) based on a determination that the circuit components are connected in parallel. The method also comprises generating a parallel netlist that describes the circuit components, the parallel netlist comprising the parallel-connected parameters.

Another aspect of this disclosure relates to an apparatus comprising at least one processor and at least one memory including computer program code for one or more programs. The at least one processor is configured to execute an instruction from the at least one memory to cause the processor to extract parallel-connected parameters associated with circuit components of an integrated circuit (IC) based on a determination that the circuit components are connected in parallel. The apparatus is also caused to generate a parallel netlist that describes the circuit components, the parallel netlist comprising the parallel-connected parameters.

A further aspect of this disclosure relates to a non-transitory computer-readable storage medium carrying computer-readable instructions which, when executed by a processor, causes the processor to extract parallel-connected parameters associated with circuit components of an integrated circuit (IC) based on a determination that the circuit components are connected in parallel. The processor is also caused to generate a parallel netlist that describes the circuit components, the parallel netlist comprising the parallel-connected parameters.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    extracting parallel-connected parameters associated with circuit components of an integrated circuit (IC) based on a determination that the circuit components are connected in parallel;
    scanning the circuit components in one of a schematic of the IC, a schematic netlist of the IC, a layout of the IC, or a layout netlist of the IC to determine circuit component parameters associated with the circuit components, wherein the circuit component parameters comprise an oxide definition index number, the oxide definition index number being indicative of which oxide definition layer of one or more oxide definition layers included in the IC each of the circuit components overlies; and
    generating a parallel netlist that describes the circuit components, the parallel netlist comprising the parallel-connected parameters and the circuit component parameters.

2. The method of claim 1, wherein
    the circuit component parameters further comprise one or more of a device name, a net identification number, a polygon identification number, a length, or a width of the circuit components,
    the circuit components are determined to be connected in parallel based on the scanning, and
    the parallel-connected parameters are added to one or more of the schematic netlist or the layout netlist to generate the parallel netlist after determining the circuit component parameters.

3. The method of claim 1, wherein a single tool determines the parallel-connected parameters, and the single tool generates the parallel netlist.

4. The method of claim 3, wherein the single tool is a layout versus schematic tool configured to compare the schematic netlist to one or more of the layout netlist or the parallel netlist.

5. The method of claim 1, wherein
    a resistive capacitance (RC) extraction tool determines the parallel-connected parameters and generates the parallel netlist,
    the RC extraction tool is configured to determine RC values associated with the circuit components,
    the RC extraction tool uses the oxide definition index number to determine the parallel-connected parameters, and the RC extraction tool generates the parallel netlist based on the oxide definition index number.

6. The method of claim 1, wherein the scanning comprises a first scan and a second scan, the first scan is performed by a first tool to determine the circuit component parameters, the second scan is performed by a second tool different from the first tool to determine the circuit components are connected in parallel, and the method further comprises:
    generating, using the first tool, the layout netlist, the layout netlist comprising the net identification number and the polygon identification number; and
    removing, using the second tool, the net identification number and the polygon identification number from the layout netlist,
    wherein the second tool generates the parallel netlist by adding the parallel-connected parameters to the layout netlist in place of the removed net identification number and the removed polygon identification number.

7. The method of claim 1, further comprising:
    generating, using a first tool, a schematic netlist of the IC, the schematic netlist describing the circuit components included in a schematic representation of the IC;
    generating, using a second tool, a layout netlist of the IC, the layout netlist describing the circuit components included in a layout representation of the IC using a first naming convention; and
    cross-referencing, using a third tool, the schematic netlist with the layout netlist to determine the circuit components included in the layout representation of the IC that are associated, the determination that the circuit components are connected in parallel being based on the determined association between the circuit components,
    wherein the third tool generates the parallel netlist by describing the circuit components included in the layout netlist using a second naming convention that ties the circuit components together indicating the circuit components are connected in parallel, the second naming convention comprising the parallel-connected parameters.

8. The method of claim 1, further comprising:
    performing a Simulation Program with Integrated Circuit Emphasis (SPICE) simulation on the IC, the SPICE simulation determining a level of performance of the IC taking the parallel-connected parameters into consideration.

9. An apparatus comprising:
    at least one processor; and
    at least one memory including computer program code for one or more programs,
    the at least one processor configured to execute an instruction from the at least one memory to cause the apparatus to:
    extract parallel-connected parameters associated with circuit components of an integrated circuit (IC) based on a determination that the circuit components are connected in parallel;
    scan the circuit components in one of a schematic of the IC, a schematic netlist of the IC, a layout of the IC, or a layout netlist of the IC to determine circuit component parameters associated with the circuit components, wherein the circuit component parameters comprise an oxide definition index number, the oxide definition index number being indicative of which oxide definition layer of one or more oxide definition layers included in the IC each of the circuit components overlies; and generate a parallel netlist that describes the circuit components, the parallel netlist comprising the parallel-connected parameters and the circuit component parameters.

10. The apparatus of claim 9, wherein
the circuit component parameters further comprise one or more of a device name, a net identification number, a polygon identification number, a length, or a width of the circuit components,
the circuit components are determined to be connected in parallel based on the scan, and
the parallel-connected parameters are added to one or more of the schematic netlist or the layout netlist to generate the parallel netlist after determining the circuit component parameters.

11. The apparatus of claim 9, wherein a single tool determines the parallel-connected parameters, and the single tool generates the parallel netlist.

12. The apparatus of claim 11, wherein the single tool is a layout versus schematic tool configured to compare the schematic netlist to one or more of the layout netlist or the parallel netlist.

13. The apparatus of claim 9, wherein
a resistive capacitance (RC) extraction tool determines the parallel-connected parameters and generates the parallel netlist,
the RC extraction tool is configured to determine RC values associated with the circuit components, the RC extraction tool uses the oxide definition index number to determine the parallel-connected parameters, and
the RC extraction tool generates the parallel netlist based on the oxide definition index number.

14. The apparatus of claim 9, wherein the scan comprises a first scan and a second scan, the first scan is performed by a first tool to determine the circuit component parameters, the second scan is performed by a second tool different from the first tool to determine the circuit components are connected in parallel, and the apparatus is further caused to:
generate, using the first tool, the layout netlist, the layout netlist comprising the net identification number and the polygon identification number; and
remove, using the second tool, the net identification number and the polygon identification number from the layout netlist,
wherein the second tool generates the parallel netlist by adding the parallel-connected parameters to the layout netlist in place of the removed net identification number and the removed polygon identification number.

15. The apparatus of claim 9, wherein the apparatus is further caused to:
generate, using a first tool, a schematic netlist of the IC, the schematic netlist describing the circuit components included in a schematic representation of the IC;
generate, using a second tool, a layout netlist of the IC, the layout netlist describing the circuit components included in a layout representation of the IC using a first naming convention; and
cross-reference, using a third tool, the schematic netlist with the layout netlist to determine the circuit components included in the layout representation of the IC that are associated, the determination that the circuit components are connected in parallel being based on the determined association between the circuit components,
wherein the third tool generates the parallel netlist by describing the circuit components included in the layout netlist using a second naming convention that ties the circuit components together indicating the circuit components are connected in parallel, the second naming convention comprising the parallel-connected parameters.

16. The apparatus of claim 9, wherein the apparatus is further caused to:
perform a Simulation Program with Integrated Circuit Emphasis (SPICE) simulation on the IC, the SPICE simulation determining a level of performance of the IC taking the parallel-connected parameters into consideration.

17. A non-transitory computer-readable storage medium comprising computer-readable instructions which, when executed by a processor, cause the processor to:
extract parallel-connected parameters associated with circuit components of an integrated circuit (IC) based on a determination that the circuit components are connected in parallel; and
generate a parallel netlist that describes the circuit components, the parallel netlist comprising the parallel-connected parameters;
generate a schematic netlist of the IC, the schematic netlist describing the circuit components included in a schematic representation of the IC;
generate a layout netlist of the IC, the layout netlist describing the circuit components included in a layout representation of the IC using a first naming convention; and
cross-reference the schematic netlist with the layout netlist to determine the circuit components included in the layout representation of the IC that are associated, the determination that the circuit components are connected in parallel being based on the determined association between the circuit components,
wherein the third tool generates the parallel netlist by describing the circuit components included in the layout netlist using a second naming convention that ties the circuit components together indicating the circuit components are connected in parallel, the second naming convention comprising the parallel-connected parameters.

18. The computer-readable storage medium of claim 17, wherein the instructions are further configured to cause the processor to:
scan the circuit components in one of a schematic of the IC, a schematic netlist of the IC, a layout of the IC, or a layout netlist of the IC to determine circuit component parameters associated with the circuit components, the circuit component parameters comprising one or more of a device name, an oxide definition index number, a net identification number, a polygon identification number, a length, or a width of the circuit components,
wherein the circuit components are determined to be connected in parallel based on the scan, the parallel netlist further comprises the circuit component parameters, and the parallel-connected parameters are added to one or more of the schematic netlist or the layout netlist to generate the parallel netlist after determining the circuit component parameters.

19. The computer-readable storage medium of claim 17, wherein the processor is caused to:
generate the schematic netlist of the IC using a first tool,
generate the layout netlist using a second tool, and
cross reference the schematic netlist with the layout netlist using a third tool.

20. The computer-readable storage medium of claim 17, wherein the instructions are further configured to cause the processor to:

perform a Simulation Program with Integrated Circuit Emphasis (SPICE) simulation on the IC, the SPICE simulation determining a level of performance of the IC taking the parallel-connected parameters into consideration.

* * * * *